United States Patent

Schmid et al.

(10) Patent No.: US 7,789,057 B2
(45) Date of Patent: Sep. 7, 2010

(54) DEVICE FOR PROTECTING STAMPED CONDUCTOR PATHS

(75) Inventors: Wolfgang Schmid, Langenargen (DE); Robert Ingenbleek, Kressbronn (DE)

(73) Assignee: ZF Friedrichshafen AG, Friedrichshfen (DE)

( * ) Notice: Subject to any disclaimer, the term of this patent is extended or adjusted under 35 U.S.C. 154(b) by 929 days.

(21) Appl. No.: 11/643,516

(22) Filed: Dec. 21, 2006

(65) Prior Publication Data

US 2007/0144478 A1    Jun. 28, 2007

(30) Foreign Application Priority Data

Dec. 22, 2005    (DE) .................... 10 2005 059 651

(51) Int. Cl.
*H01T 13/00* (2006.01)
*H05K 1/02* (2006.01)
*B60R 16/02* (2006.01)

(52) U.S. Cl. .................... 123/143 C; 310/68 R
(58) Field of Classification Search ............. 123/143 C; 310/68 R, 71, 239, 43, 45
See application file for complete search history.

(56) References Cited

U.S. PATENT DOCUMENTS

| | | | | | |
|---|---|---|---|---|---|
| 4,698,729 | A | * | 10/1987 | Riesner et al. | 361/716 |
| 5,127,440 | A | * | 7/1992 | Maas et al. | 137/884 |
| 5,152,322 | A | * | 10/1992 | Maas et al. | 137/884 |
| 5,309,053 | A | * | 5/1994 | Ade | 310/71 |
| 6,049,043 | A | * | 4/2000 | Tonejc | 174/250 |
| 7,015,618 | B2 | * | 3/2006 | Kasdorf | 310/239 |
| 2004/0027014 | A1 | | 2/2004 | Weigold et al. | |

FOREIGN PATENT DOCUMENTS

| | | |
|---|---|---|
| DE | 41 22 076 A1 | 1/1992 |
| DE | 101 19 404 A1 | 10/2002 |
| DE | 102 42 936 A1 | 3/2004 |

OTHER PUBLICATIONS

Moeller-Werr: Leitfaden der Elektrotechnik, Konstruktion elektrischer Maschinen. Band III, B. G. Teubner Verlagsgesellschaft, Leipzig, 1950, pp. 94-95; Figs. 94.1, 96.1. (To Follow).

* cited by examiner

*Primary Examiner*—Hieu T Vo
(74) *Attorney, Agent, or Firm*—Davis & Bujold, P.L.L.C.

(57) ABSTRACT

A device for the protection of stamped conducting paths particularly in a motor vehicle. The device having a complete envelope (4) around the conducting paths which can be made from a sprayed elastic material.

8 Claims, 1 Drawing Sheet

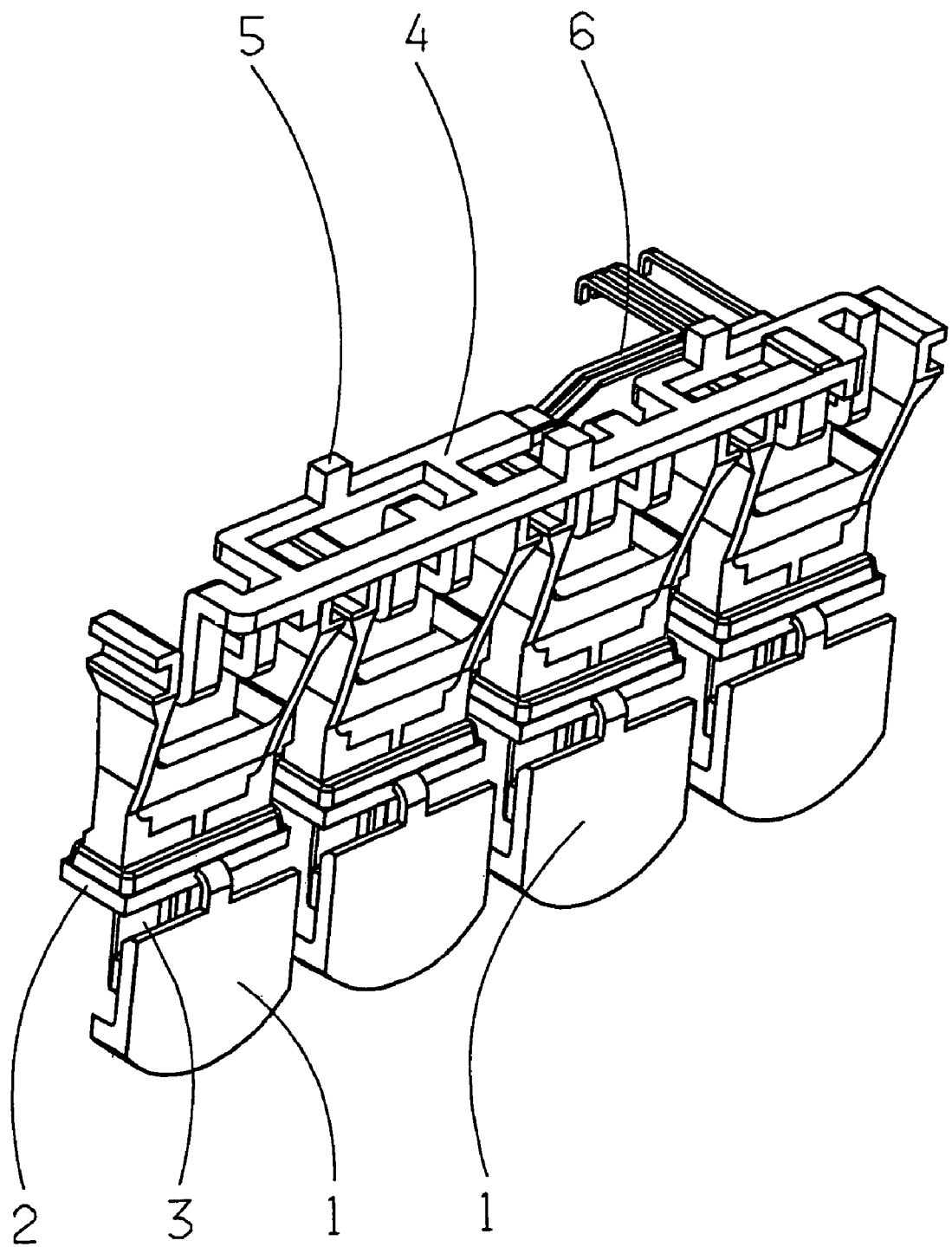

DEVICE FOR PROTECTING STAMPED CONDUCTOR PATHS

This application claims priority from German Application Serial No. 10 2005 059 651.7 filed Dec. 22, 2005.

FIELD OF THE INVENTION

The present invention concerns a device for the protection of stamped conducting paths.

BACKGROUND OF THE INVENTION

The use of stamped conducting paths in automotive technology, for example, in the mechanical and electronic systems associated with transmissions, is known. In this context, it is particularly important to protect the conducting paths against machining swarf (risk of short-circuit), to dampen vibrations (risk of stamping grid fracture) and to compensate tolerances.

In the designs known from the prior art, the stamping grid is placed in a plastic housing for swarf protection and also provided, if necessary, with a coating of insulating varnish. Protection against vibrations is usually achieved by partial spray covering with a thermoplastic material, which forms corresponding support points. Complete spray covering with a thermoplastic material to solve the swarf and vibration problem is known, but has the disadvantage that elasticity and, therefore, the desired tolerance compensation, are lost because of the rigidity of the enveloping thermoplastic, especially in the case of plug contacts.

For example DE 101 19 404 A1 describes an electronically commutated direct-current motor. In this known direct-current motor with a stator having multi-phase stator windings, a housing that accommodates the stator with a commutation device arranged in the housing for the sequential connection of the winding phases to a mains direct voltage, the device comprising a plurality of semiconductor switches and an electronic control circuit mounted on a printed circuit board for controlling the semiconductor switches and with a plug connector for connection to the mains direct voltage to make the commutation device more robust all the electronic components of the commutation device that carry power currents, such as the plug connector, the semiconductor switches, the electrolytic capacitors, etc., are contacted by way of a stamped grid which forms the electric connection to the stator winding and to the printed circuit board. The stamped grid is embedded in an insulating body made by spray molding with plastic and serves as the support for the semiconductor switches and the printed circuit board.

From DE 102 42 936 A1 a contact support for incorporation in a steering wheel body of an automobile is known. In this case, the contact support is formed of a stamped grid covered by a sprayed plastic body and can be fixed by way of spacer bolts onto a bottom of a steering wheel body under spring stress.

The purpose of the present invention is to provide a device for the protection of conducting paths, in particular in a motor vehicle, which avoids the disadvantages of the designs known from the prior art. In particular, the invention aims to ensure protection against swarf and to dampen vibrations, while at the same time enabling tolerance compensation.

SUMMARY OF THE INVENTION

Accordingly, it is proposed that the stamped grids comprising the stamped conducting paths should be completely enveloped or covered by a sprayed elastic material. This retains sufficient elasticity to ensure tolerance compensation while giving complete protection against swarf.

According to the invention, additional swarf protection can be provided for plug contacts by spray molded covering caps (preferably using a sprayed elastic material here as well). Furthermore, the plugs can have a swarf-tight seal made from the sprayed elastic material.

In an advantageous further development of the invention, it can be provided that, by appropriate design measures known from the prior art, the conducting paths are plastically deformed after being enclosed. For example, this can be made possible by indentations in the elastic covering material.

To dampen vibrations, according to the invention, support protrusions are provided on one side or on alternate sides on the envelope or elastic sprayed covering around the conducting paths, which ensure that the conducting paths are supported elastically and thereby provide better vibration damping that by way of hard support points.

BRIEF DESCRIPTION OF THE DRAWING

The invention will now be described, by way of example, with reference to the accompanying drawing in which:

FIG. 1 is a perspective illustration of a device for protecting stamped conductor paths.

DETAILED DESCRIPTION OF THE INVENTION

The device, according to the invention, for protecting stamped conducting paths in a motor vehicle comprises a complete envelope 4 around the conducting paths, which can be made of a sprayed elastic material. Thanks to this complete envelope 4, protection against swarf is ensured so that any risk of short-circuiting is excluded. In addition, the elasticity of the envelope or sprayed covering 4 allows tolerance compensation.

To dampen vibrations and avoid any risk of stamped grid fracture, the device comprises elastic supporting protrusions 5 on the sprayed covering 4, which ensure that the conducting paths are supported elastically.

In FIG. 1, according to an advantageous further development of the invention spray-molded covering caps 1 are provided for contact plugs 3 of the conducting paths, which offer additional swarf protection. Furthermore, swarf-tight plug seals are provided, indexed as 2. In addition, an area with conducting paths spray-coated with hard plastic is shown, indexed as 6.

The design, according to the invention, provides a device for the protection of stamped conducting paths, which can be made inexpensively and which protects the conducting paths against short-circuiting and stamped grid fracture due to vibrations, while ensuring sufficient tolerance compensation.

REFERENCE NUMERALS

1 covering caps
2 plug seal
3 contact plug
4 envelope, elastic sprayed covering
5 support protrusion
6 area with conducting paths covered with sprayed hard plastic

The invention claimed is:
1. A device for protecting stamped conducting paths in a motor vehicle, the device comprises a complete envelope (4)

around the conducting paths which is made from an elastic material which is sprayed-molded, and elastic support protrusions (5) are provided on at least one of the envelope (4) and a surface of the spray-molded elastic material to ensure elastic support of the conducting paths.

2. The device for protecting stamped conducting paths according to claim 1, further comprising swarf-tight plug seals (2) which are made from the spray-molded elastic material.

3. The device for protecting stamped conducting according to claim 1, further comprising at least one covering cap (1), made from the spray-molded elastic material, to protect a respective contact plug (3).

4. A device for protecting stamped conducting paths in a motor vehicle, the device comprises a complete envelope (4) around the conducting paths which is made from an elastic material which is sprayed-molded, and covering caps (1), made from the spray-molded elastic material, to protect contact plugs (3).

5. The device for protecting stamped conducting paths according to claim 4, further comprising at least one elastic support protrusion (5), provided on at least one of the envelope (4) and a surface of the spray-molded elastic material, for ensuring elastic support of the conducting paths.

6. A device for protecting stamped conducting paths in a motor vehicle, the device comprises a complete envelope (4) around the conducting paths which is made from an elastic material which is sprayed-molded, and the envelope (4) is plastically deformed after spray molding.

7. The device for protecting stamped conducting paths according to claim 6, wherein the envelope (4) has indentations to allow plastic deformation thereof.

8. A device for protecting a stamped conducting path in a motor vehicle, the device comprising:

an envelope (4) for surrounding at least one conducting path, with the envelope (4) being made from an elastic material which is sprayed-molded;

the envelope (4) has at least one elastic support protrusion (5) for ensuring elastic support of the conducting paths;

the envelope (4) has at least one covering cap (1), made from the spray-molded elastic material, for protecting at least one contact plug (3) of the envelope (4);

the spray-molded elastic material forms a swarf-tight seal (2) between the at least one contact plug (3) and a surface of the envelope (4); and the envelope (4) has indentations therein for enabling plastic deformation.

* * * * *